US007153590B2

(12) United States Patent
Gales et al.

(10) Patent No.: US 7,153,590 B2
(45) Date of Patent: Dec. 26, 2006

(54) COMPOSITE COPPER FOIL AND MANUFACTURING METHOD THEREOF

(75) Inventors: Raymond Gales, Harlange (LU); René Lanners, Bettborn (LU); Michel Streel, Houffalize (BE); Akitoshi Suzuki, Utsunomiya (JP)

(73) Assignee: Circuit Foil Luxembourg Trading S.a.R.L., Luxembourg (LU)

( * ) Notice: Subject to any disclaimer, the term of this patent is extended or adjusted under 35 U.S.C. 154(b) by 559 days.

(21) Appl. No.: 10/204,300

(22) PCT Filed: Jan. 18, 2001

(86) PCT No.: PCT/EP01/00544

§ 371 (c)(1),
(2), (4) Date: Aug. 19, 2002

(87) PCT Pub. No.: WO01/63016

PCT Pub. Date: Aug. 30, 2001

(65) Prior Publication Data

US 2003/0012975 A1    Jan. 16, 2003

(30) Foreign Application Priority Data

Feb. 24, 2000  (LU) .................................. 90532

(51) Int. Cl.
 - *B32B 15/04* (2006.01)
 - *B32B 15/20* (2006.01)
 - *C25C 1/12* (2006.01)
 - *C25D 7/04* (2006.01)
 - *H05K 3/00* (2006.01)

(52) U.S. Cl. ............... 428/607; 428/674; 428/336; 205/574; 205/152; 205/191; 361/748

(58) Field of Classification Search ............... 428/674, 428/675, 676, 677, 687, 606, 607, 200, 216, 428/336; 205/574, 109, 116, 151, 152, 170, 205/182, 291, 296, 191, 192, 193, 215, 220, 205/339, 243; 361/748
See application file for complete search history.

(56) References Cited

U.S. PATENT DOCUMENTS 3,998,601 A      12/1976  Yates et al.
4,088,544 A  *   5/1978   Hutkin ..................... 428/545

(Continued)

FOREIGN PATENT DOCUMENTS

EP          0442187 A1      8/1991

(Continued)

*Primary Examiner*—Michael E. Lavilla
(74) *Attorney, Agent, or Firm*—McCormick, Paulding & Huber LLP

(57) ABSTRACT

A composite copper foil (10) comprises a carrier foil (12) formed by electrodeposition onto a cathode, the carrier foil (12) having a cathode side formed in contact with the cathode and an opposite electrolyte side. A very thin release layer (14) is on the electrolyte side of said carrier foil (12). A thin functional foil (16) formed by deposition of copper has a front side in contact with the release layer (14) and an opposite back side. The electrolyte side of the carrier foil (12) has a surface roughness Rz less than or equal to 3.5 μm. There is also presented a method for manufacturing such a composite copper foil.

28 Claims, 9 Drawing Sheets

U.S. PATENT DOCUMENTS

| | | | |
|---|---|---|---|
| 4,715,116 A * | 12/1987 | Thorpe et al. | 29/846 |
| 5,096,522 A * | 3/1992 | Kawachi et al. | 156/151 |
| 5,262,247 A * | 11/1993 | Kajiwara et al. | 428/607 |
| 5,433,840 A | 7/1995 | Dahms et al. | |
| 5,834,140 A | 11/1998 | Wolski et al. | |
| 5,863,410 A | 1/1999 | Yates et al. | |
| 5,997,710 A | 12/1999 | Ohara et al. | |
| 6,346,335 B1 * | 2/2002 | Chen et al. | 428/629 |
| 6,419,149 B1 * | 7/2002 | Yano et al. | 228/235.1 |

FOREIGN PATENT DOCUMENTS

| | | |
|---|---|---|
| EP | 0841412 A1 | 5/1998 |
| EP | 0930811 A1 | 7/1999 |
| JP | 10036991 | 2/1998 |
| JP | 2000-269637 * | 9/2000 |

* cited by examiner

10

COMPOSITE COPPER FOIL AND MANUFACTURING METHOD THEREOF

FIELD OF THE INVENTION

The present invention relates to a composite copper foil and to a manufacturing method thereof. The composite copper foil may be used namely in the manufacture of printed circuit boards.

BACKGROUND OF THE INVENTION

Such a composite copper foil is disclosed in U.S. Pat. No. 3,998,601. It comprises a thin copper foil-hereinafter called thin functional foil-mounted on a carrier foil, wherein the carrier foil is provided with an intermediate, very thin release layer which permits clean and easy separation of the thin functional foil. The carrier foil, when produced by conventional electrolytic techniques, will have a smooth cathode side (also known as shiny side) formed in contact with a rotating titanium cathode drum and an opposite, rough electrolyte side (also known as matte side). The surface of the thin functional foil conforms to that of the carrier foil, since the release layer is very thin. U.S. Pat. No. 3,998,601 further suggests that the thin functional foil should be deposited on the electrolyte side of the carrier foil to obtain a surface having a satin finish, or on its cathode side to obtain a surface having a mirror-like finish.

For the manufacture of printed circuit boards (PCB), a low surface roughness, i.e. a mirror-like surface finish, is preferred. Therefore, the thin functional foil is in practice always electrodeposited on the cathode side after deposition of the release layer. Typically the surface roughness is given by the Rz parameter, which is for the cathode side: $1.5 \ \mu m \leq Rz \leq 3.5 \ \mu m$. Since the thin functional foil surface conforms to that of the cathode side, its surface roughness is substantially equivalent to that of the cathode side.

Such a composite copper foil has proved very advantageous for the manufacture of PCB's. Indeed, during lamination of the composite copper foil on a resinous insulating substrate the thin functional foil is effectively protected by the carrier foil against resin bleed-trough and surface damages. Hence, after release of the carrier foil there is provided a copper clad laminate having a very smooth surface.

With regard to actual and future miniaturization requirements, it is desirable to increase the number of conducting elements per surface unit and to reduce the size of the conducting elements and the space between them (pitch). Such circuit patterns may only be obtained by applying very high density circuit pattern photo-definition and chemical etching processes to ultra-smooth and defect free surfaces. It will be appreciated that known composite copper foils do not provide a functional foil surface which is sufficiently free of defects for these increased miniaturization requirements. Indeed, cathode drums generally exhibit surface flaws which are responsible for the presence of striae on the cathode side of the carrier foil and consequently also on the surface of the thin functional foil formed thereon. Until now these striae have not been considered as problematic for the manufacture of circuit patterns, but this is no longer true when facing future miniaturization specifications.

One way to improve the surface quality of functional foil could be to form the cathode side of the carrier foil on a cathode drum having an ultra-smooth surface roughness, in particular free of surface flaws. But the actual technique does not allow the manufacture of ultra-smooth cathode drums at reasonable costs. Furthermore, such an ultra-smooth cathode drum would be easily damaged, and the maintenance of such an ultra-smooth cathode drum would be very expensive.

SUMMARY OF THE INVENTION

The object of the present invention is to provide a composite copper foil having a thin functional foil with an ultra-smooth, high quality surface at reasonable costs. According to the present invention, this object is achieved by a composite copper foil according to claim 1.

Contrary to the conventional technique for obtaining a functional foil with a smooth surface, the front side of the functional foil of the present invention is formed on an ultra-smooth electrolyte side and not on a shiny cathode side of an electrodeposited carrier foil.

As the thin functional foil is deposited over the release layer on the electrolyte side of the carrier foil, its front side conforms to the surface of the electrolyte side of the carrier foil and therefore has a surface roughness Rz substantially equivalent to that of the electrolyte side. As the electrolyte side of the carrier foil is not formed on a cathode, it is free of "cathode induced" surface flaws. It follows that the front side of the thin functional foil, which is a mirror of the electrolyte side of the carrier foil, is also completely free of surface flaws, as e.g. striae.

A first advantage of the surface free of defects of this thin functional foil is that photo-definition of circuit patterns can be improved. Another advantage is the homogeneity of chemical etching: the more homogeneous the surface, the more homogeneous the etching. Moreover, the new front side of the functional foil provides optimal conditions during process steps of PCB manufacture, and namely the copper plating step.

As the functional foil is thin, its back side has a surface roughness substantially equivalent to that of the front side, namely $Rz < 3.5 \ \mu m$. Hence, the back side has a surface roughness which lends itself very well to a uniform, fine nodular surface treatment.

Furthermore, the presence of a carrier foil is very advantageous, since it provides a support for the thin functional foil, and proves very efficient for protecting the ultra-smooth surface during handling and lamination.

Advantageously, the carrier foil predominantly consists of equiaxed crystals, at least in the vicinity of the interface with the release layer. Such a crystal structure favors the formation of an ultra-smooth electrolyte side. The carrier foil may be formed by electrodeposition of a metal or alloy, advantageously inexpensive, such as iron or brass. However, the carrier foil is preferably an electrodeposited copper foil. The carrier foil may have a thickness between 18 µm and 105 µm.

Advantageously, the thin functional foil predominantly consists of equiaxed crystals, whereby it conforms to the underlying ultra-smooth and homogeneous surface more easily. The thin functional foil front side may have a surface roughness parameter Rz less than or equal to 3.5 µm. Preferably, the thin functional foil has a thickness between 2 and 13 µm. Such a thin functional foil having an equiaxed structure, allows very rapid, fine and homogeneous etching. Moreover, this structure facilitates the formation of sharp and rectangularly shaped conducting elements. In other words, the number of conducting elements per surface unit may be increased, the size of the conducting elements and the space between them (pitch) reduced, thereby enabling the formation of very high density circuit patterns. Furthermore a 3 or 5 µm thick functional foil may be directly drilled by laser means.

The release layer and the carrier foil may be peeled off simultaneously. The release layer may be an electrodeposited, chromium based layer. Preferably, its thickness is lower than 1.5 µm, more preferably the release layer is about 0.1 µm thick. As the electrolyte side and the front side are both ultra-smooth and homogeneous, homogeneous adhesion between the carrier foil and the functional foil is obtained. Advantageously the thickness of the chromium layer is adjusted in such a way that the peel strength necessary to peel off simultaneously the release layer and the carrier foil is between 30 and 150 N/m. This warrants a sufficient adhesion between the carrier foil and the thin functional foil to provide an optimal protection of the front surface of the thin functional foil during lamination and the different PCB manufacturing process steps, together with an easy peel-off of the carrier foil.

According to another aspect of the invention, there is provided a method for manufacturing a composite copper foil, comprising the following steps:

(a) forming a carrier foil by electrodeposition onto a cathode, the carrier foil having a cathode side formed in contact with said cathode and an opposite electrolyte side;
(b) forming a very thin release layer on the electrolyte side of the carrier foil; and
(c) forming a thin functional foil by deposition of copper on the release layer, the thin functional foil having a front side facing the release layer and an opposite back side.

According to an important aspect of the invention, the electrodeposition of the carrier foil is carried out so as to form an electrolyte side with a surface roughness Rz less than or equal to 3.5 µm. The method of the invention allows the manufacture of a thin functional foil having an ultra-smooth, very homogeneous surface, which is completely free of surface defects, such as striae.

The electrodeposition of the carrier foil may be carried out from an electrolyte solution comprising 70 to 110 g/l of copper (as copper sulfate), 80 to 120 g/l of sulfuric acid, as well as 1 to 10 ppm of a carrier agent, 1 to 10 ppm of a leveling agent and 0.1 to 2 ppm of a brightener agent.

The carrier agent may be a high molecular weight polymer soluble in the acid chosen from: gelatin (Mw=2 000 to 100 000), polyacrylamide (Mw=500 000 to 12 000 000), polyethylene glycol (Mw=400 to 10 000), polyethylene glycol monomethyl ether (Mw=300 to 5 000), polyethylene glycol dimethyl ether (Mw=250 to 3 000), hydroxy ethyl cellulose (Mw=10 000 to 100 000). The leveling agent may be an organic compound containing a nitrogen atom or an oxygen atom chosen from: polyethylene imine, poly(propylene glycol-b-ethylene glycol-b-propylene glycol) bis (2-aminopropyl ether), N-allylthiourea. The brightener agent may be a sulfured compound chosen from: 2-mercaptobenzimidazol, 3-3'-thiodipropionic acid, sodium 3-mercapto 1-propanesulfonate, thio diglycolic acid, thiolactic acid.

Preferably, equiaxed crystals are predominantly formed in the carrier foil, at least in the vicinity of the interface with the release layer, so as to favor the formation of a carrier foil having an ultra-smooth, uniform and defect free electrolyte side. This may be achieved when operating under controlled electrolysis parameters and when using the above mentioned electrolyte solution. The thin functional foil, which is also preferably electrodeposited under controlled conditions, may also consist of equiaxed crystals.

Advantageously, at a further step (d) a surface treatment is performed on the back side of the thin functional foil in order to enhance its bonding to a future resin layer or substrate. This surface treatment may comprise the formation of fine copper nodules on the back side in order to leave a smooth and regular impression of the etched copper in the resin. It follows that adhesion is sufficiently high for thin conducting elements, etching speed is high, conducting elements show fine and sharp outlines, and the fine nodular impression is ideal for sequential build-up.

At a further step (e) a passivation treatment may be applied to the back side of the thin functional foil, preferably after the surface treatment. Both sides of the functional foil are subsequently protected, the front side being protected by the carrier foil, and the back side by a passivation layer.

Advantageously, at a further step (f), a resin layer is formed on the back side of the thin functional foil. The composite copper foil may therefore be directly used in the manufacture of copper clad laminates, printed circuit boards, and multi-layer printed circuit boards, namely by sequential build-up.

BRIEF DESCRIPTION OF THE DRAWINGS

The present invention will be more apparent from the following description of a not limiting embodiment with reference to the attached drawings, wherein.

DETAILED DESCRIPTION OF A PREFERRED EMBODIMENT

Figure 1:
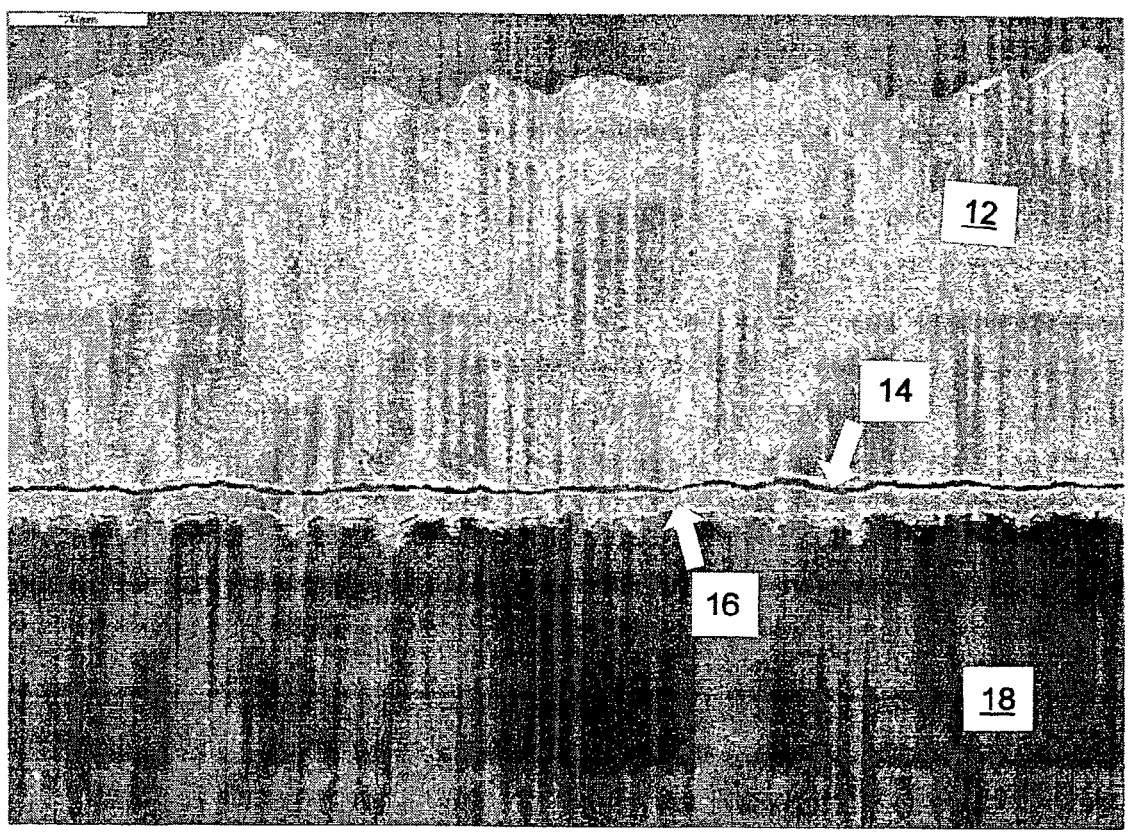
FIG. 1: is a cross-sectional S.E.M.—view of a composite copper foil of the invention.
Figure 1:

FIG. 1 shows a view, obtained by Scanning Electron Microscopy (magnification: 1000×), of a composite copper foil 10 in accordance with the invention. An understanding of this composite copper foil 10 and of its characteristics will be made clear by the description of the different manufacturing steps of a preferred embodiment of the method in accordance with the invention.

At a first manufacturing step (a) a carrier foil 12 is formed by electrodeposition of copper from an electrolyte solution onto a rotating titanium cathode drum. The electrolyte solution is circulated between the cathode drum and a closely spaced anode. Hence, the carrier foil 12 has a cathode side formed in contact with the drum and an opposite electrolyte side formed in the electrolyte solution. The electrodeposition of the carrier foil 12 is carried out so as to form an electrolyte side having a surface roughness Rz less than or equal to 3.5 µm (Rz≦3.5 µm). The roughness Rz was measured according to DIN 4768. Preferably, the parameters of electrodeposition are adjusted to grow a carrier foil 12 with a thickness between 18 and 105 µm, e.g. of 35 µm or 70 µm.

At a second step b), a very thin release layer 14 is formed on the electrolyte side of the carrier foil 12.

At a third step c), a thin functional foil 16 is formed by electrodeposition of copper on the release layer 14. The thin functional foil 16 has a front side in contact with the release layer 14 and an opposite back side. Preferably, the parameters of electrodeposition are adjusted to grow a functional foil 16 with a thickness between 2 and 13 µm. For example, the functional foil 16 may be grown to a thickness of 3, 5, 9 or 12 µm.

As mentioned at step (a) the electrodeposition of the carrier foil 12 is carried out so as to obtain a carrier foil 12 with an electrolyte side having a surface roughness Rz less than or equal to 3.5 µm. As a matter of fact, in the conventional technique, the surface roughness of the electrolyte side is large, in particular larger than that of the cathode side and the functional copper foil is formed on the cathode side. The release layer, which is a very thin layer, conforms to the cathode side surface. As a consequence, the front side of the functional foil, which is formed over the release layer, conforms to that of the cathode side. It will be clearly understood that the cathode side, in the conventional practice, is used for the formation of the functional foil because it has a lower surface roughness than the electrolyte side. Indeed, an even surface is desirable for a fine and sharp photo-chemical etching of circuit patterns. Since the cathode side is formed in contact with the cathode drum, its surface roughness depends on that of the cathode drum. The surface roughness of the cathode side can therefore not be lower than that of the cathode drum surface, and a conventional cathode side may be too rough to form a functional foil having an ultra-smooth front side thereon. Moreover, a cathode drums generally exhibits surface flaws which are responsible for the presence of striae on the cathode side (see FIG. 2—magnification 1000×) and consequently also on the front side of the thin functional foil.

By forming, according to the present method, a carrier foil having an electrolyte side with a surface roughness Rz≦3.5 µm, there is provided a high quality support surface for the formation of the functional foil 16. It follows that the front side of the functional foil 16 formed on this electrolyte side is also of high quality: ultra-smooth, homogeneous, and free of defects. Furthermore, as the functional foil 16 is thin, the surface roughness of the back side is approximately equivalent to that of the front side.

The electrodeposition operating parameters and the electrolyte composition should be controlled so as to obtain a very fine grained electrodeposited carrier foil 12, preferably with equiaxed grains. Equiaxed grains or crystals, having an aspect ratio of the grain nearly equal to one, are preferred to columnar crystals as they promote the formation of a smooth, homogeneous surface. Therefore, it is preferable to have equiaxed crystals at least in the vicinity of the interface with the release layer 14, as they form the surface supporting the thin functional foil 16.

Such a carrier foil may be obtained by carrying out the electrodeposition at step a) from an electrolyte solution comprising 70 to 110 g/l of copper (as copper sulfate) and 80 to 120 g/l of sulfuric acid together with three kinds of organic additives so as to predominantly form equiaxed crystals in the carrier foil 12. Hence, the electrolyte solution also comprises:

1) 1 to 10 ppm of a carrier agent, which is a high molecular weight polymer soluble in the acid chosen from: Gelatin (Mw=2 000 to 100 000), Polyacrylamide (Mw=500 000 to 12 000 000), polyethylene glycol (Mw=400 to 10 000), polyethylene glycol monomethyl ether (Mw=300 to 5 000), polyethylene glycol dimethyl ether (Mw=250 to 3 000), Hydroxy ethyl cellulose (Mw=10 000 to 100 000); and 2) 1 to 10 ppm of a leveling agent, which is an organic compound containing a nitrogen atom or an oxygen atom chosen from: polyethylene imine, poly(propylene glycol-b-ethylene glycol-b-propylene glycol) bis (2-aminopropyl ether), N-Allylthiourea; and 3) 0.1 to 2 ppm of a brightener agent, which is a sulfured compound chosen from: 2-mercaptobenzimidazol, 3-3'-thiodipropionic acid, sodium 3-mercapto 1-propanesulfonate, thio diglycolic acid, thiolactic acid.

When using the above mentioned electrolyte solution, the operating current density should be in the range of about 5 to 80 A/dm$^2$. The operating temperature should be in the range of 30 to 70° C.

Figure 2:
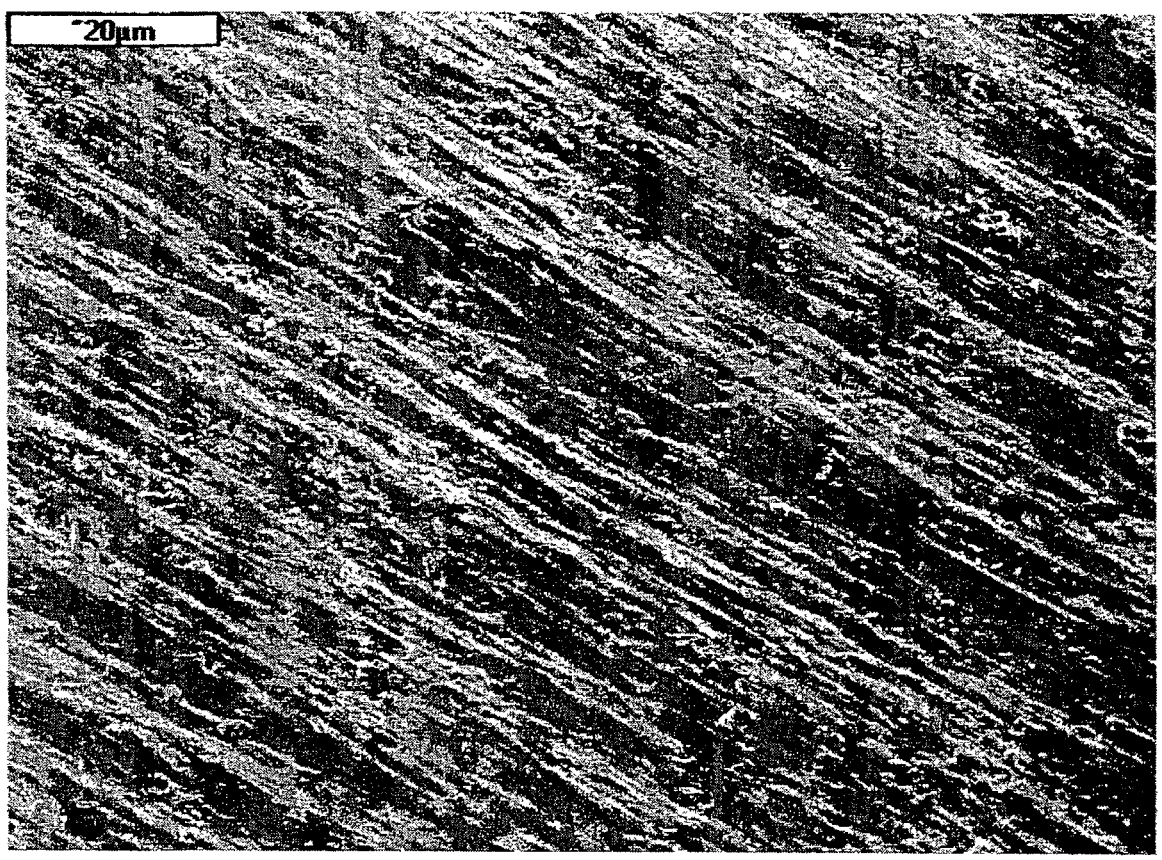
FIG. 2: is a S.E.M.—view of the cathode side of a conventional carrier foil.
Figure 3:
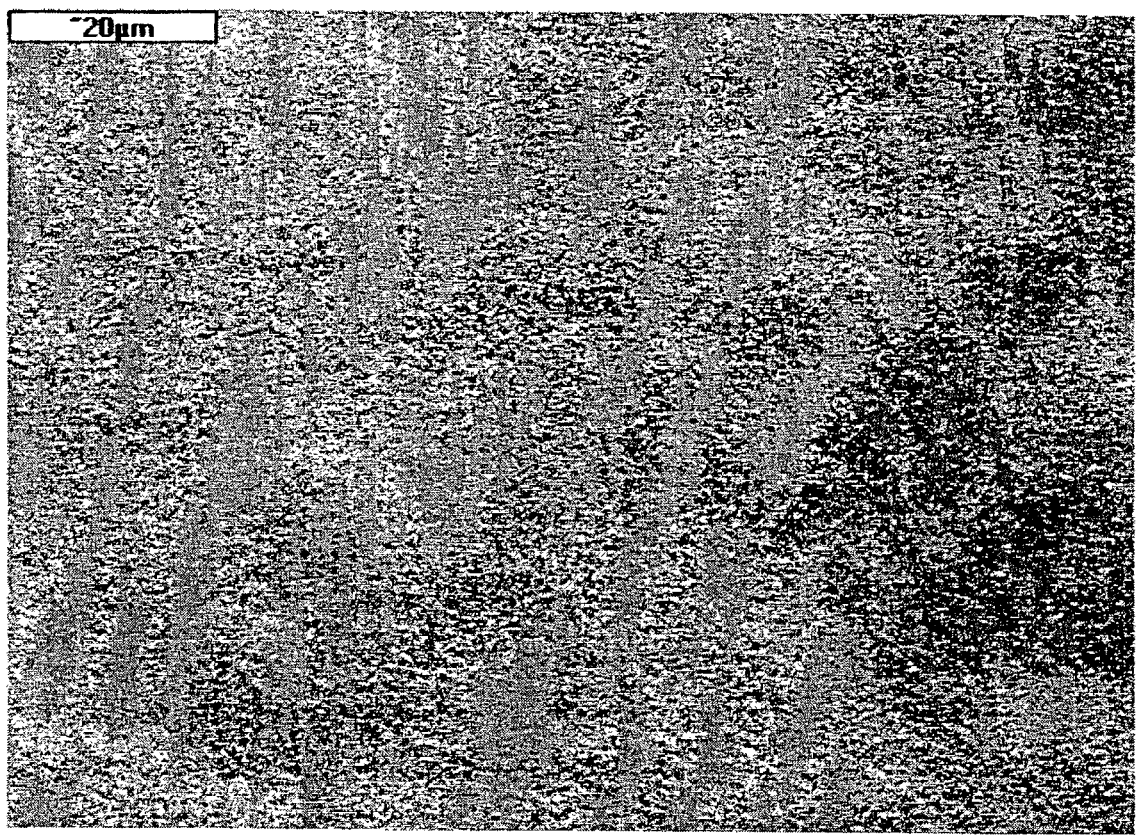
FIG. 3: is a S.E.M.—view of the electrolyte side of the carrier foil of the composite copper foil shown in FIG. 1.

FIG. 3 shows a S.E.M.—view (magnification 1000×) of the electrolyte side of the carrier foil 12 obtained under the operating conditions described above. The difference with FIG. 2 is striking: there are no striae and the surface is homogeneous and smooth.

Then, in accordance with step (b), a very thin release layer is formed on the electrolyte side of the carrier foil. This very thin release layer 14 is preferably a chromium based layer with a thickness of about 0.1 µm. It will be understood that this thickness of 0.1 µm is not measured but calculated from the weight of chromium deposited per unit surface and from the chromium density. Such a release layer is typically formed in a chromium bath containing 180 to 300 g/l of chromic acid (calculated as $CrO_3$) and 1.8 to 3 g/l of sulfuric acid ($H_2SO_4$). The electrical current density should be in the range of 5 to 40 A/dm$^2$ and the bath temperature in the range of 18 to 60° C.

The release layer 14 permits an easy separation of the carrier foil 12, leaving a clean and defect-free front side. It shall be observed that the adhesion provided by the release layer 14 should be sufficient to prevent the carrier foil 12 from peeling off during the many PCB process steps that the composite copper foil 10 may go through. Such PCB process steps are various: coating with insulating resin, sizing the composite copper foil 10 from roll into sheets, register holes punching, lay-up and lamination, trimming, through holes drilling using the carrier foil 12 as "drill bit entry".

It shall be noted that since the interface between the release layer 14 and the functional foil 16 is ultra-smooth and homogeneous, the peel strength necessary to peel off the carrier foil 12 is homogeneous and relatively low over the whole interface, as compared to a release layer having the same thickness exhibiting a rough interface with the functional foil. This is particularly advantageous for lamination, where the peel strength conventionally increases, due to the thermal treatment needed to adhere the functional foil 16 to a resinous substrate. Therefore, the peel strength will be lower than in the conventional technique, even with polymers having high glass transition temperatures. The chromium layer thickness should be adjusted in such a way that the peel strength needed to peel off the carrier layer be in the range of 30 to 150 N/m.

At next step (c) the thin functional foil 16 is formed on the release layer 14 by electrodeposition of copper from an electrolyte solution. Here again, the electrodeposition is advantageously controlled so as to obtain an equiaxed crystal structure in order to promote the formation of an ultra-smooth surface. It is believed that, since the functional copper foil 16 grows as an epitaxial layer (i.e. deposited over another copper layer-the chromium based release layer 14 being generally too thin to impose its structure), the structure is imposed by the carrier foil 12. Therefore, an equiaxed structure in the functional foil 16 may be obtained from an electrolyte solution comprising 30 to 110 g/l of copper (as copper sulfate) and 30 to 120 g/l of sulfuric acid. The operating electric current density should be in the range of 5 to 60 A/dm$^2$. The temperature should be in the range of 30 to 70° C.

Figure 4:
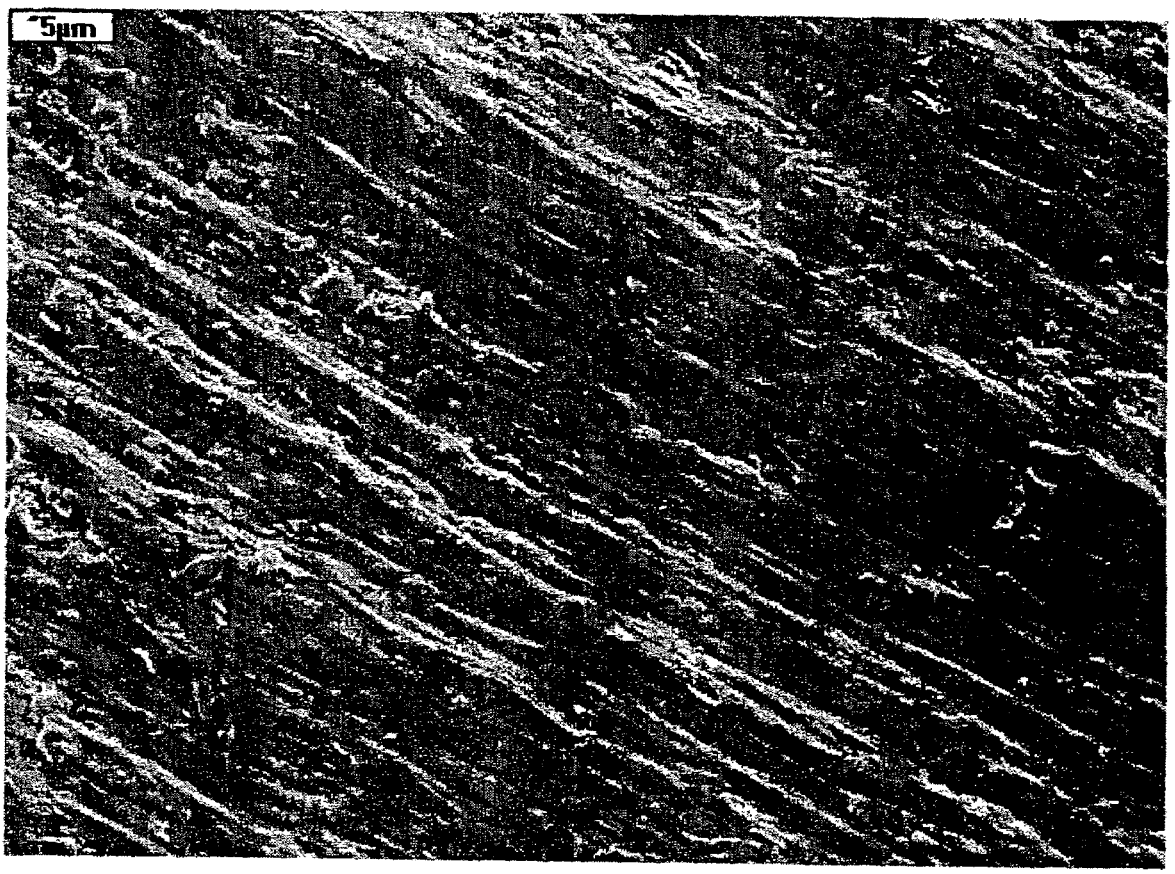
FIG. 4: is a S.E.M.—view of the front side of a conventional functional foil.
Figure 5:
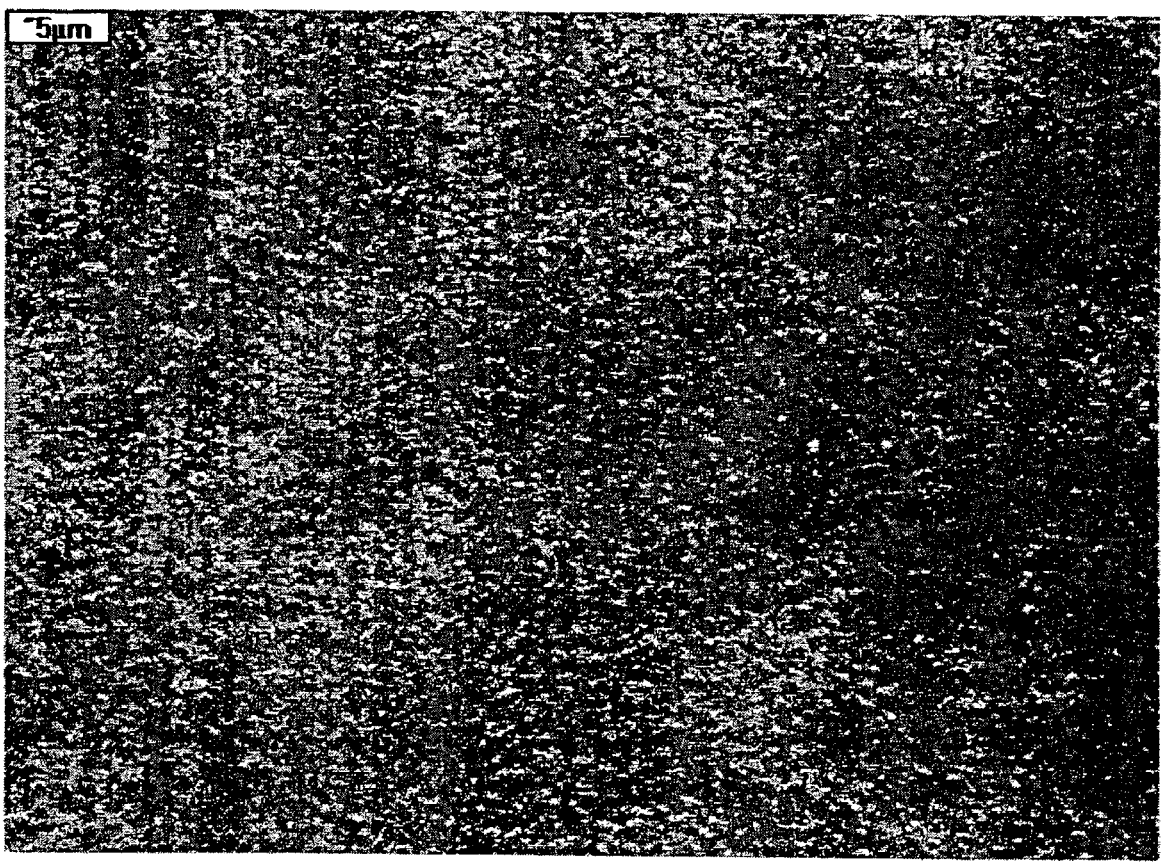
FIG. 5. is a S.E.M.—view of the front side of the functional foil of the composite copper foil shown in FIG. 1.

FIG. 4 shows a S.E.M.—view (magnification 2000×) of a front side of a functional foil obtained in the conventional technique, whereas FIG. 5 shows a S.E.M.—view (magnification 2000×) of the front side of the functional foil 16, which was formed on the electrolyte side shown in FIG. 3. The surface quality of the front side of the functional foil 16 is clearly better than that of the conventional front side of FIG. 4. As can be seen, the front side shown in FIG. 5 is free of striae. Furthermore, this surface is uniform with a low surface roughness (Rz≦3.5 μm). As explained, the back side is approximately as smooth as the front side (Rz≦3.5 μm). It follows that the functional foil 16 is thin, and has two ultra-smooth surfaces. Such a functional foil 16 enables very rapid and homogeneous etching, and the formation of very high density circuit patterns. Furthermore, the equiaxed structure favorizes the formation of sharp and rectangularly shaped conducting elements.

Figure 6:
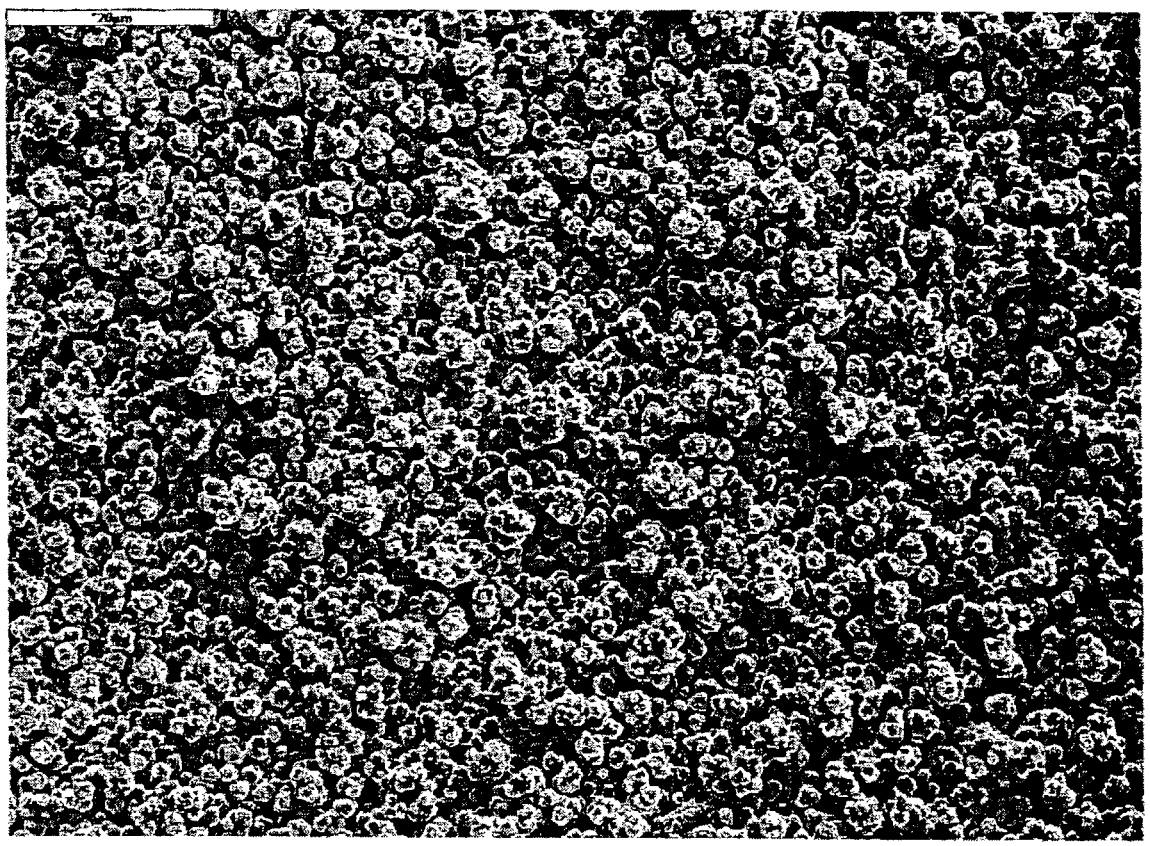
FIG. 6: is a S.E.M.—view of a back side treated with a conventional nodular surface treatment.
Figure 7:
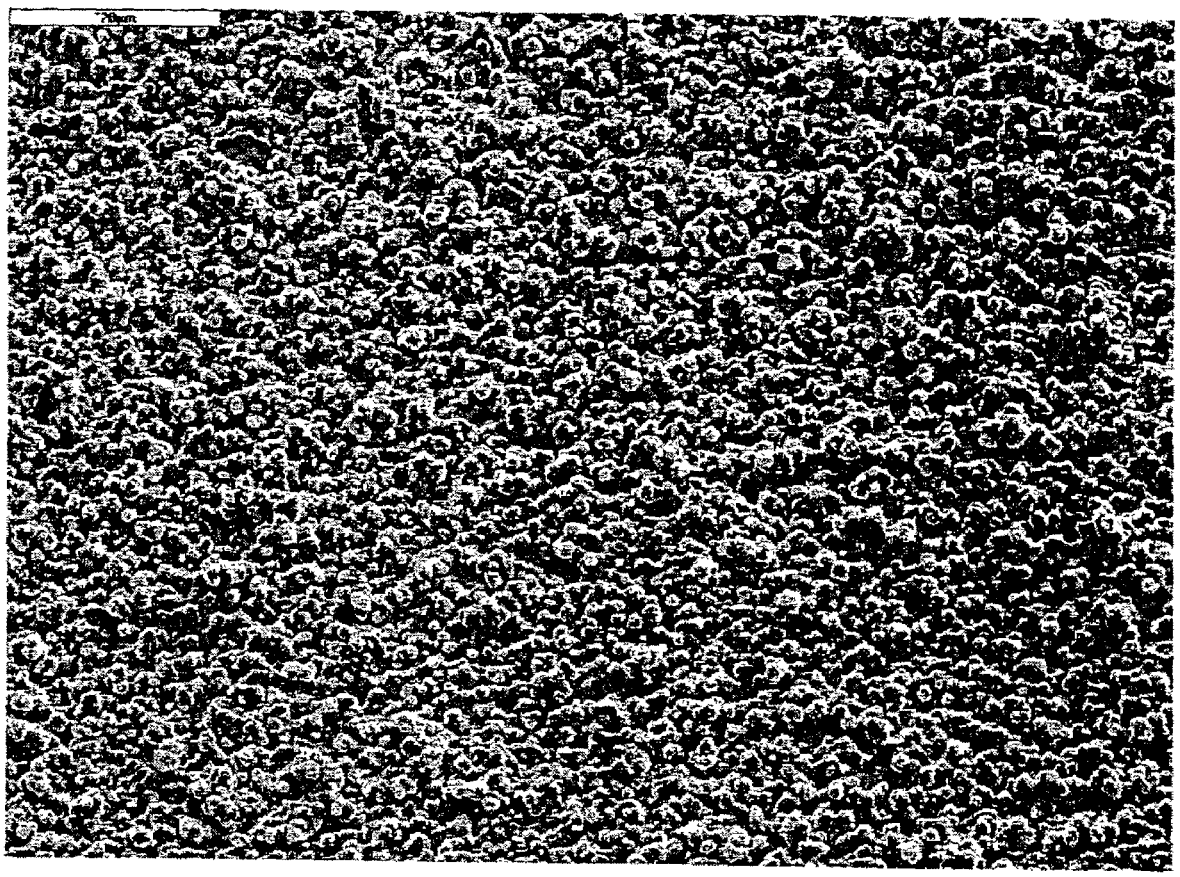
FIG. 7: is a S.E.M.—view of the back side of the composite copper foil of FIG. 1 treated with a fine nodular surface treatment.
Figure 8:
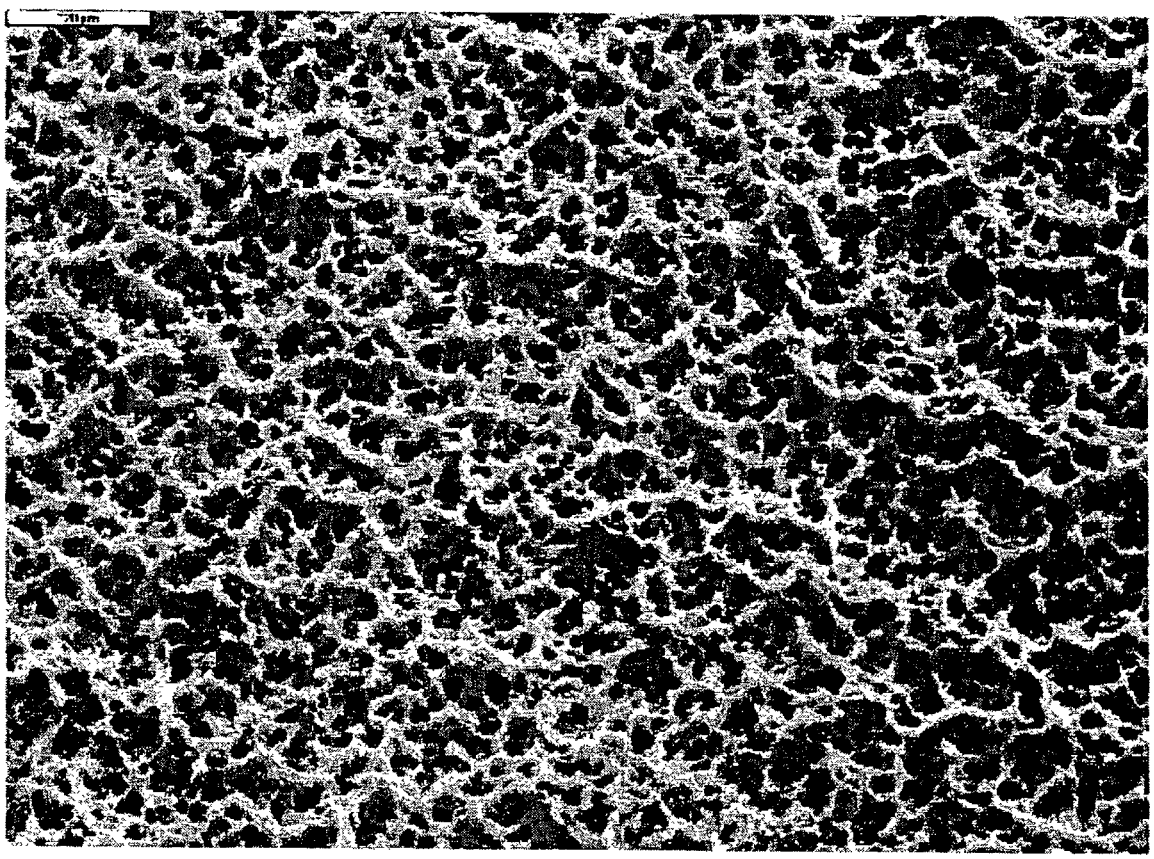
FIG. 8: is a S.E.M.—view of the impression in a resin of the conventionally treated back side of FIG. 6.
Figure 9:
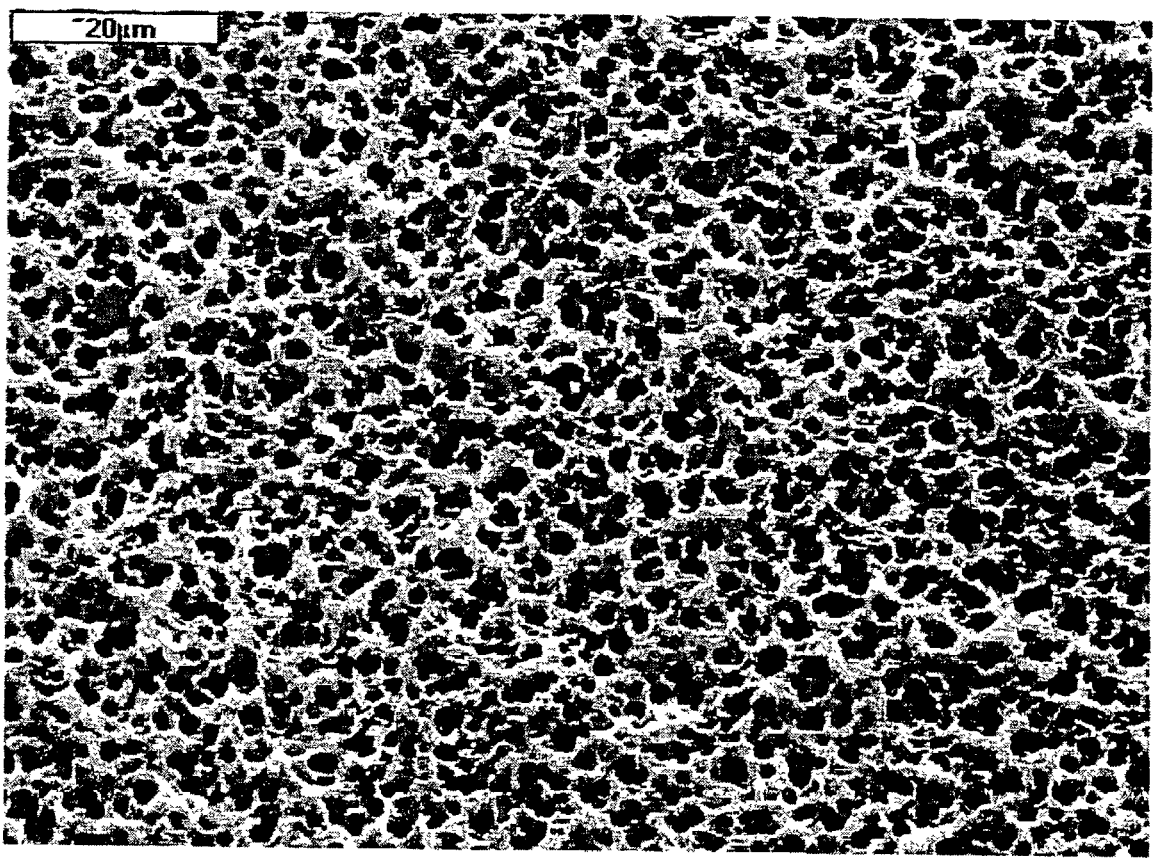
FIG. 9: is a S.E.M.—view of the impression in a resin of the back side of FIG. 7 treated with a fine nodular surface treatment.

At a further manufacturing step (d) a surface treatment is advantageously performed on the back side of the functional foil 16. This consists in forming fine copper nodules on the back side, whereby the bonding, i.e. adhesion, of the functional foil 16 to a resinous substrate can be enhanced. In FIG. 6, the surface of a conventionally treated back side is shown. The nodules are coarse, and induce long etching durations as well as rough nodular impressions in the resinous substrate (see FIG. 8). Conducting elements would be poorly defined and sequential build up hindered. A very fine nodular treatment has been developed for this smooth back side, as can be seen in FIG. 7. The fine copper nodules warrant a regular surface and a fine nodular impression after etching, as shown in FIG. 9. Consequently, adhesion is sufficiently high for thin conducting elements, etching speed is high, conducting elements show fine and sharp outlines, and the fine nodular impression is ideal for sequential build-up.

At another manufacturing step (e), a zinc and chrome based passivation layer is formed on the surface treated back side. Both sides of the functional foil 16 are now protected; the front side by the carrier foil 12 and the back side by the passivation layer. A similar passivation treatment may also be applied to the electrode side of the carrier foil in order to avoid a blue window frame oxidation.

Finally, at a further manufacturing step (e), a resinous layer 18 is formed on the back side of the thin functional foil 16. The composite copper foil 10 may thereby be used directly in the manufacture of PCB, namely in the manufacture of multi-layer PCB by sequential build-up, where the composite copper foil 10 can be directly laminated on a core board. The composite copper foil 10 may be used in many PCB manufacturing processes, namely in multilayer PCB manufacturing by sequential build-up. When the thin functional foil 16 is 3 or 5 μm thick, it may be directly drilled by a laser beam, for micro-via holes drilling for example.

It shall be noted that the formation of the thin functional foil on the release layer has been described by means of electrodeposition of copper. However, the formation of the thin functional foil shall not be limited to this method. For example, copper may be deposited on the release layer by a PVD or CVD process followed by an electrodeposition in order to increase the thickness of the thin functional foil.

The invention claimed is:

1. A composite copper foil comprising:
    a carrier foil formed by electrodeposition onto a cathode, said carrier foil having a cathode side formed in contact with said cathode and an electrolyte side, opposite said cathode side, wherein said electrolyte side has a surface roughness Rz less than or equal to 3.5 μm;
    a release layer on the electrolyte side of said carrier foil;
    a functional foil formed by deposition of copper and having a front side in contact with said release layer and an opposite back; and
    wherein said carrier foil predominantly consists of equiaxed crystals, at least in the vicinity of the interface with said release layer.

2. The composite copper foil as claimed in claim 1, wherein said functional foil predominantly consists of equiaxed crystals.

3. The composite copper foil as claimed in claim 1, wherein said carrier foil is an electrodeposited copper foil and has a thickness between 18 μm and 105 μm.

4. The composite copper foil as claimed in claim 1, wherein said front side of said functional foil has a surface roughness Rz less than or equal to 3.5 μm.

5. The composite copper foil as claimed in claim 4, wherein said back side of said functional foil has a surface roughness Rz less than or equal to 3.5 μm.

6. The composite copper foil as claimed in claim 1, wherein said functional foil is electrodeposited and has a thickness between 2 and 13 μm.

7. The composite copper foil as claimed in claim 1, wherein said release layer and said carrier foil can be peeled off simultaneously.

8. The composite copper foil as claimed in claim 7, wherein said release layer is an electrodeposited, chromium based layer.

9. The composite copper foil as claimed in claim 8, wherein the thickness of said chromium based layer is adjusted in such a way that a peel strength of between 30 and 150 N/m is necessary to peel off simultaneously said release layer and said carrier foil.

10. The composite copper foil as claimed in claim 8, wherein said release layer has a thickness lower than 1.5 μm.

11. The composite copper foil of claim 10 wherein said release layer has a thickness of less than 0.1 μm.

12. The composite copper foil of claim 1 wherein:
    the functional foil has a thickness less than a thickness of the carrier foil; and the release layer has a thickness less than the thickness of the functional foil.

13. The composite copper foil as claimed in claim 1, further comprising fine copper nodules on said back side of said functional foil.

14. The composite copper foil as claimed in claim 13, further comprising a resin layer on said back side of said functional copper foil.

15. A method of using a composite foil as claimed in claim 1 in the manufacture of at least one of copper dad laminates, printed circuit boards, and multi-layer printed circuit boards by sequential build-up, the method comprising the step of: laminating the composite foil to a core board.

16. A method for manufacturing a composite copper foil, comprising the following steps:
(a) forming a carrier foil by electrodeposition onto a cathode, said carrier foil having a cathode side formed in contact with said cathode and an opposite electrolyte side, wherein said electrodeposition of said carrier foil is carried out so as to form an electrolyte side with a surface roughness Rz less than or equal to 3.5 µm;
(b) forming a release layer on said electrolyte side of said carrier foil; and
(c) forming a functional foil by deposition of copper, said functional foil having a front side in contact with said release layer and an opposite back side.

17. The method as claimed in claim 16, wherein the electrodeposition of step (a) is carried out from an electrolyte solution comprising 70 to 110 g/l of copper (as copper sulfate), 80 to 120 g/l of sulfuric acid, as well as 1 to 10 ppm of a carrier agent, 1 to 10 ppm of a leveling agent and 0.1 to 2 ppm of a brightener agent;
said carrier agent being a high molecular weight polymer soluble in the acid chosen from: gelatin (Mw=2,000 to 100,000), polyacrylamide (Mw=500,000 to 12,000,000), polyethylene glycol (Mw=400 to 10,000), polyethylene glycol monomethyl ether (Mw=300 to 5,000), polyethylene glycol dimethyl ether (Mw=250 to 3,000), hydroxy ethyl cellulose (Mw=10,000 to 100,000);
said leveling agent being an organic compound containing a nitrogen atom or an oxygen atom chosen from: polyethylene imine, poly(propylene glycol-b-ethylene glycol-b-propylene glycol) bis (2-aminopropyl ether), N-allylthiourea; and
said brightener agent being a sulfured compound chosen from: 2-mercaptobenzimidazol, 3-3'-thiodipropionic acid, sodium 3-mercapto 1-propanesulfonate, thio diglycolic acid, thiolactic acid.

18. The method as claimed in claim 16, wherein said electrodeposition of step (a) is carried out so as to form predominantly equiaxed crystals in said carrier foil, at least in the vicinity of the interface with said release layer.

19. The method as claimed in claim 16, wherein said carrier foil is an electrodeposited copper foil and has a thickness between 18 µm and 105 µm.

20. The method as claimed in claim 16, wherein said functional foil is electro-deposited and has a thickness between 2 and 13 µm.

21. The method as claimed in claim 16, wherein said deposition of step (c) is carried out so as to, form predominantly equiaxed crystals in said functional foil.

22. The method as claimed in claim 16, wherein said release layer is an electrodeposited, chromium based layer.

23. The method as claimed in claim 22, wherein said release layer has a thickness lower than 1.5 µm.

24. The method of claim 23 wherein said release layer has a thickness of less than 0.1 µm.

25. The method as claimed in claim 16, comprising a further step (d) wherein a surface treatment is applied on said back side of said functional foil in order to enhance its surface bond.

26. The method as claimed in claim 25, wherein said surface treatment comprises forming ultra fine nodules on the back side of said functional foil.

27. The method as claimed in claim 25, comprising a further step (e) wherein a passivation layer is formed on the surface treated back side of said functional foil.

28. The method as claimed in claim 27, comprising a further step (f) wherein a resin layer is formed over said passivation layer on said back side of said functional foil.

* * * * *